US007920013B2

(12) United States Patent
Sachdev et al.

(10) Patent No.: US 7,920,013 B2
(45) Date of Patent: Apr. 5, 2011

(54) SYSTEMS AND METHODS FOR OSCILLATION SUPPRESSION IN SWITCHING CIRCUITS

(75) Inventors: Pinkesh Sachdev, Santa Clara, CA (US); Christopher Umminger, Mountain View, CA (US)

(73) Assignee: Linear Technology Corporation, Milpitas, CA (US)

( * ) Notice: Subject to any disclaimer, the term of this patent is extended or adjusted under 35 U.S.C. 154(b) by 106 days.

(21) Appl. No.: 12/425,052

(22) Filed: Apr. 16, 2009

(65) Prior Publication Data
US 2009/0261898 A1 Oct. 22, 2009

Related U.S. Application Data

(60) Provisional application No. 61/124,636, filed on Apr. 18, 2008.

(51) Int. Cl.
*H03K 17/16* (2006.01)
(52) U.S. Cl. .......................... 327/379; 327/384; 327/389
(58) Field of Classification Search .................. 327/387, 327/379, 384
See application file for complete search history.

(56) References Cited

U.S. PATENT DOCUMENTS

| | | | | |
|---|---|---|---|---|
| 5,736,890 A * | 4/1998 | Yee et al. | .................. | 327/423 |
| 5,914,569 A * | 6/1999 | Bildgen | .................. | 315/209 R |
| 6,815,940 B2 * | 11/2004 | Nakashimo | .................. | 323/288 |
| 6,903,597 B2 * | 6/2005 | Tai | .................. | 327/434 |
| 7,046,050 B1 * | 5/2006 | Schottler | .................. | 327/108 |
| 2002/0021150 A1 * | 2/2002 | Tuchiya et al. | .................. | 327/108 |
| 2003/0042938 A1 * | 3/2003 | Shvarts | .................. | 327/108 |
| 2004/0217783 A1 * | 11/2004 | Gee | .................. | 327/112 |
| 2008/0018366 A1 * | 1/2008 | Hanna | .................. | 327/112 |
| 2009/0261798 A1 * | 10/2009 | Sachdev et al. | .................. | 323/288 |

OTHER PUBLICATIONS

Positive High Voltage Ideal Diode-OR with Input Supply and Fuse Monitors, LTC4355, Linear Technology, 1-18.
MOSFET Diode-OR Controller, LT4351, Linear Technology, 1-20.
ORing MOSFET Controller with Ultra-Fast 200ns Turn-Off, MAX5079, 1-18, 2005.
Full Featured N+1 and ORing Power Rail Controller, TPS2410, TPS2411, Texas Instruments, 1-26, Feb. 2007.

* cited by examiner

*Primary Examiner* — Lincoln Donovan
*Assistant Examiner* — Ryan C Jager
(74) *Attorney, Agent, or Firm* — McDermott Will & Emery LLP

(57) ABSTRACT

A switching circuit configured to reduce the effects of signal oscillation on the operation of the switching circuit is provided. The switching circuit may include signal oscillation and detection circuitry that suppresses control signals during a detected oscillation, allowing stored energy to naturally decay in the switching circuit and thereby prevent unwanted extension of the oscillation that may be caused by the repeated switching of a semiconductor element coupled between the input and output of the switching circuit.

26 Claims, 7 Drawing Sheets

SYSTEMS AND METHODS FOR OSCILLATION SUPPRESSION IN SWITCHING CIRCUITS

PRIORITY CLAIM

This application claims priority pursuant to 35 U.S.C. §119 to U.S. Provisional Application Ser. No. 61/124,636 filed Apr. 18, 2008.

FIELD OF INVENTION

The present invention generally relates to switching circuits, and more particularly, to circuits and methods for suppressing oscillation or ringing that occurs in switching circuits due to changing conditions at the load or input.

BACKGROUND

Signal oscillation is a common phenomena in electronic circuits. Such signal oscillation may be purposefully created by circuit designers, such as in the case of a clock signal or crystal oscillator, for use as a timing signal or control signal in a digital circuit. Other signal oscillations, however, are generated unintentionally during circuit operation, and, in many instances, are undesirable or even detrimental to the intended circuit operation. For example, an impedance mismatch in a telecommunications system may cause signal oscillations due to signal reflections, resulting in an unwanted echo during voice communication.

Other examples include ideal diode applications, such as redundant power systems, where sudden changes in input or output conditions cause an abrupt current change within a switching circuit. Such abrupt changes in current may cause parasitic inductance and capacitance in the switching circuit to charge and discharge each other in an alternate fashion, resulting in an unwanted resonant signal oscillation. Left unchecked, such signal oscillation may propagate through the control loop of the switching circuit and cause instability, severely limiting the usefulness of the circuit.

Because of the unpredictable nature of such occurrences, it would be desirable to provide circuits and methods which can detect and suppress such oscillations when they occur, allowing the switching circuit to remain stable and operational despite changing input or output conditions.

SUMMARY

A switching circuit configured to reduce the effects of signal oscillation on the operation of the switching circuit is provided. In one embodiment of the present invention, the switching circuit comprises an input node for receiving an input signal, a sensing circuit that senses variation in the input signal; and an oscillation detection and suppression circuit coupled to the sensing circuit that detects signal oscillation based on a control signal received from the sensing circuitry, wherein the oscillation detection and suppression circuitry is configured to selectively suppress the control signal when a signal oscillation state is detected, allowing the switching circuit to remain in an ON or OFF state during a detected oscillation such that stored energy causing the signal oscillation is allowed to decay, thereby substantially preventing the switching circuit from experiencing an extended oscillation time.

BRIEF DESCRIPTION OF THE DRAWINGS

The invention is illustrated in the figures of the accompanying drawings which are meant to be exemplary and not limiting, in which like references are intended to refer to like or corresponding parts, and in which.

DETAILED DESCRIPTION

Figure 1:
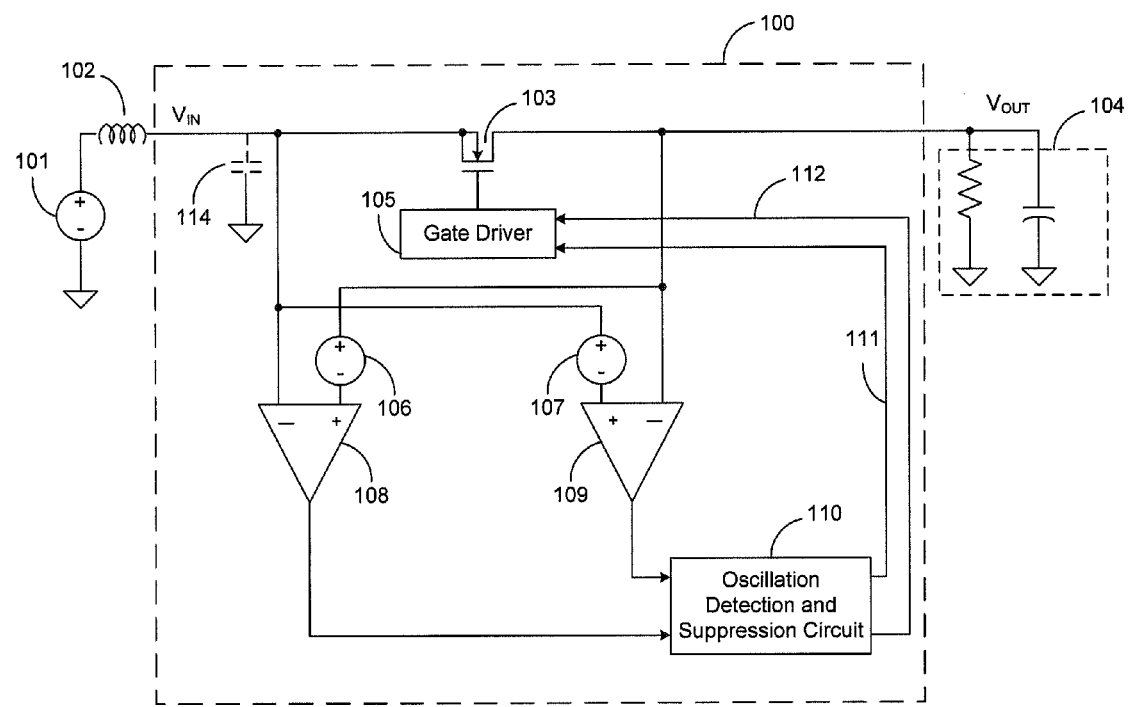
FIG. 1 is a schematic diagram of a switching circuit that suppresses signal oscillation constructed in accordance with the principles of the present invention.

A switching circuit 100, constructed in accordance with the principles of the present invention, is shown in FIG. 1. As shown, circuit 100 may include an NMOS MOSFET switch 103, parasitic input capacitance 114, a gate driver circuit 105, an oscillation detection and suppression circuit 110 with outputs 111 and 112, an input under-voltage comparator circuit 108, a lower limit voltage reference 106, an over-voltage comparator circuit 109, and an upper limit voltage reference 107.

Oscillation detection and suppression circuit 110 may be any suitable digital or analog circuitry for controlling circuit 100 among the operational states shown in FIG. 3 based on input from comparators 108 and 109 (discussed in more detail below). Aspects of possible specific embodiments of circuit 110 are shown in FIGS. 4A-4C and FIG. 5. MOSFET 108 may be any suitable semiconductor switching element such as a field effect or bipolar junction transistor such as an NMOS or NPN transistor and preferably includes fast switching characteristics and an appropriate power rating.

Gate driver circuitry 105 may employ some or all of the circuits and methods described in commonly owned co-pending application entitled "Systems And Methods For Fast Switch Turn ON Approximating Ideal Diode Function," filed Apr. 16, 2009, Ser. No. 12/425,015, and which is hereby incorporated by reference in its entirety. For example, gate driver circuitry 105 may include a voltage multiplier circuit such as a charge pump and reservoir capacitor (not shown) to allow NMOS switch 103 to have a fast turn ON (and turn OFF) capability and allow NMOS switch 103 to function as an ideal diode. This circuitry may be controlled by oscillation detection and suppression circuit 110 as further described herein.

Moreover, circuit 100 may be coupled to a load which is generally depicted as resistor-capacitor ("RC") network 104 in FIG. 1, and to an input voltage source 101 having parasitic inductance 102.

One way in which switching circuit 100 has been improved as compared to conventional switching systems is by the addition and arrangement of the sensing circuitry formed by comparators 108 and 109 and oscillation detection and suppression circuit 110. Comparators 108 and 109 sense the operating conditions of circuit 100 at its input and output nodes with respect to certain preset thresholds established by references 106 and 107, communicating these conditions to circuit 110.

Based on this information, circuit 110 determines whether circuit 100 is experiencing an oscillation or ringing condition, which may be caused by an abrupt change in current. If such a condition is detected, circuit 110 commands NMOS 103 OFF or ON (through gate driver circuit 105) for a preset period of time to allow the detected oscillating signal to attenuate to within acceptable limits. This prevents (or significantly decreases the likelihood) that circuit 100 will turn ON and OFF rapidly, causing chatter at NMOS 103, degrading regulation and/or causing further instability in its control loop. One benefit of this arrangement is that it allows circuit 100 to operate in unpredictable environments by quickly and predictably recovering from unexpected or extreme variations in output or input conditions.

Circuit 100 may operate as follows. Assume an input voltage $V_{IN}$ is provided to switching circuit 100 by supply 101. This input voltage is coupled to reference voltage 107 and sensed by comparator 109 (by coupling it to its non-inverting terminal). The inverting terminal of comparator 109 is coupled to the output of circuit 100 (e.g., the drain of NMOS 103). When the input voltage $V_{IN}$ is greater than the output voltage $V_{OUT}$ by the value set by reference voltage 107, comparator 109 trips producing a logic high at its output. This threshold point may be considered a high voltage threshold point ($V_{HTH}$), which is used to detect an over-voltage condition at the input.

When this threshold is surpassed, the output of comparator 109 trips and produces a logic high signal which is processed by suppression and detection circuit 110, which provides a control signal via path 111 to gate driver circuit 105. In response to a logic high signal, driver circuit 105 may generate a fast turn ON signal based on the output of voltage multiplier and/or a reservoir capacitor in conjunction with a pull-up switch (not shown), to turn NMOS 103 ON, allowing power to flow from the input, thereby increasing the output voltage of circuit 100.

Using this configuration, the gate of NMOS 103 is driven to a boosted voltage level produced by a voltage multiplier circuit very quickly, substantially reducing, or virtually eliminating turn ON delays associated with any intrinsic capacitance. Moreover, in cases where the output voltage of the voltage multiplier is selected such that it is large enough to ensure NMOS 103 is turned ON substantially fully, the present invention provides a way to turn NMOS 108 ON substantially immediately, and substantially fully, when the input voltage of circuit 100 rises above the high voltage threshold $V_{HTH}$, thus closely approximating the switching characteristics of an ideal diode.

For example turn ON times under about 5 microseconds can be obtained, depending specific circuit implementation, with turn ON times under 1 microsecond achievable.

As shown in FIG. 1, comparator 109 is responsible for sensing a high voltage condition at the input of circuit 100, and reporting such to oscillation and suppression circuit 110 when this condition is detected.

Initially, when a voltage from source 101 is first applied to switching circuit 100 during power-up, NMOS 103 is OFF. As the input voltage is applied to the non-inverting terminal of comparator 109 and rises above the voltage provided by reference 107, it trips, generating a logic high at its output, causing circuit 110 and gate driver circuit 105 to turn NMOS 103 ON. This allows power to flow from source 101 to load 104 (through NMOS 103) generating an output voltage $V_{OUT}$.

At this point, circuit 100 may be considered to be "ON." During operation, comparator 108 monitors the input voltage of circuit 100 to detect any under-voltage conditions. Similar to comparator 109 described above, comparator 108 senses the output voltage of circuit 100 by coupling it to its non-inverting terminal. Thus, whenever the input voltage $V_{IN}$ is less than the output voltage $V_{OUT}$ by the value of reference voltage 106, comparator 108 trips producing a logic high at its output. This threshold point may be considered the low voltage threshold $V_{LTH}$. Surpassing this threshold causes oscillation detection and suppression circuit 110 and gate driver circuit 105 to turn NMOS 103 OFF in an attempt to prevent reverse current flow from output to input.

This turn OFF threshold represents the point at which circuit 100 turns OFF due to an under-voltage condition at its input and may be considered the low voltage threshold $V_{LTH}$. Thus, with this configuration, comparator 108 is responsible for sensing an under-voltage condition at the input of circuit 100, and turns circuit 100 OFF when such a condition is detected.

During normal operation, power may flow from source 101 to load 104 as regulated by comparators 108 and 109 and voltage references 106 and 107. For example, assume an input voltage $V_{IN}$ of 3 volts, and reference voltage of 100 mV for each reference 106 and 107. When the output voltage drops below 2.9 volts, comparator 109 may trip causing NMOS 103 to turn ON and raise the output voltage level above 2.9 volts. Conversely, if the output voltage rises above 3.1 volts, comparator 108 may trip turning NMOS 103 OFF in an attempt to prevent reverse current from flowing into source 101 from load.

In certain applications, however, the conditions at the input and/or output of circuit 100 may change rapidly causing a sudden and abrupt change in current direction. For example, circuit 100 may be coupled to other external circuitry, such as other power supply circuitry or other reactive loads which may cause a voltage spike to occur at the output of circuit 100 under certain conditions (e.g., due to a sudden and significant decrease in load, the discharge of a large reactive load, connection of additional power supply circuitry, etc.).

Such a voltage spike may momentarily cause current to flow in the reverse direction in circuit 100 (from the output to the input). As a result, because the voltage spike exceeds the low voltage threshold $V_{LTH}$, comparator 108 trips, turning NMOS 103 OFF, disconnecting supply 101 from the output of circuit 100.

Nevertheless, when the current direction switches, the parasitic inductance 102 associated with supply 101 may become energized. This may cause parasitic inductance 102 and parasitic capacitance 114 to form a resonant circuit at the input of switching circuit 100, which charge and discharge each other alternately, resulting in an unwanted resonant signal oscillation. This signal oscillation may continue until the energy initially stored in parasitic inductance 102 dissipates.

Figure 2:
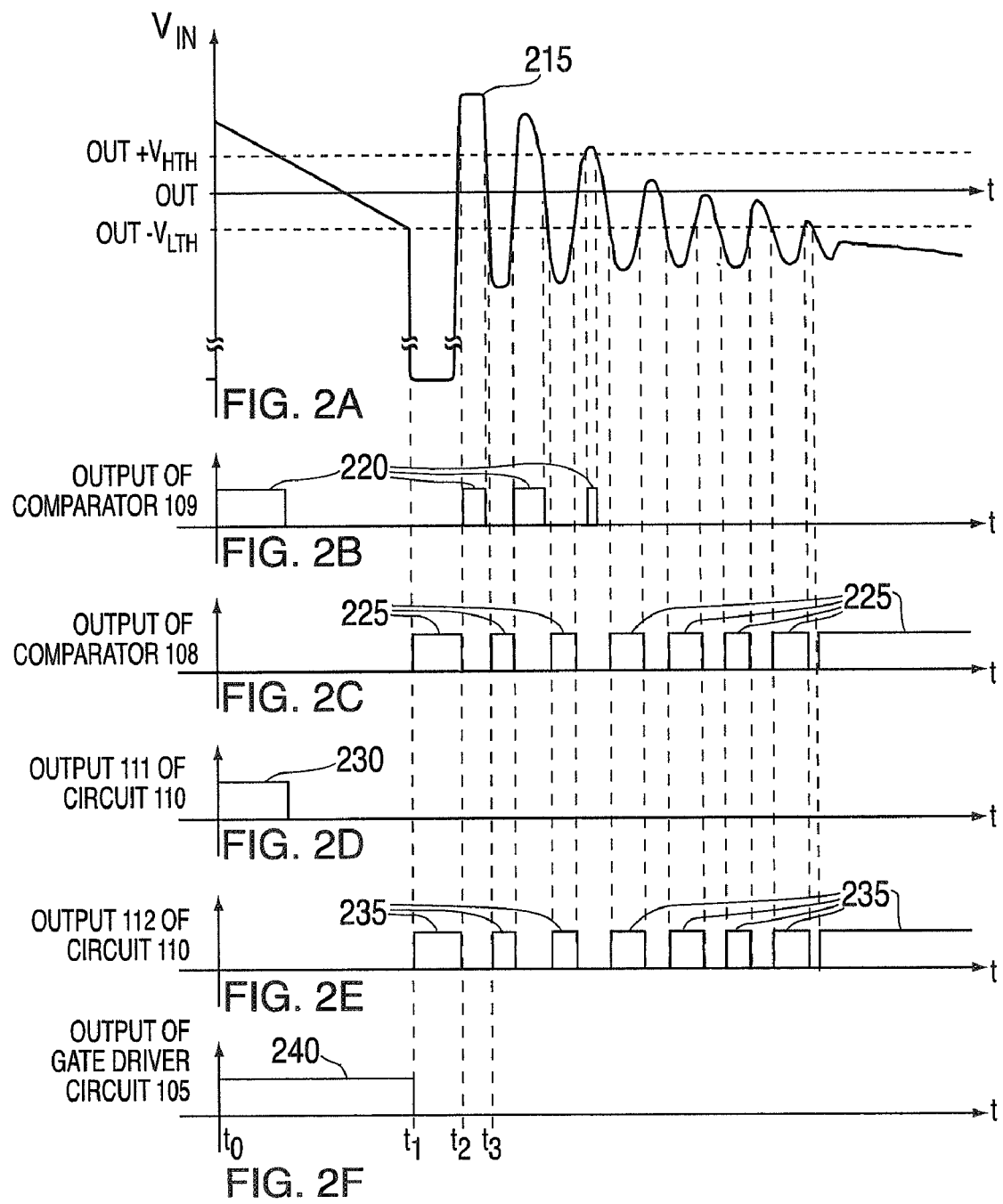
FIGS. 2A-2F are graphs illustrating various waveforms associated with the operation of the switching circuit shown in FIG. 1

A graph illustrating this phenomena in shown in FIG. 2A. As shown, waveform 215, which represents a signal observed at the source of NMOS 103, begins at time $t_0$ when the input $V_{IN}$ is greater than the output by more than $V_{HTH}$. In this case, the output of comparator 109 is high, with NMOS 103 ON. As the input voltage decreases, the low voltage threshold is exceeded at time $t_1$ which causes comparator 108 to trip, turning NMOS 103 OFF, exciting the resonant circuit formed by parasitic inductance 102 and parasitic capacitance 114, causing an input over-voltage condition at time $t_2$. At time $t_3$ an under-voltage condition occurs with this sequence repeating itself until the energy stored in parasitic inductance 102 is dissipated.

As mentioned above, such oscillation is undesirable or even detrimental to the intended circuit operation. Thus, in accordance with the present invention, circuit 100 is configured such that it significantly reduces or substantially eliminates such oscillation through the selective suppression of certain control signals that contribute to or cause oscillation.

The operation of circuit 100, and how these functional goals are achieved, may be better understood by considering graphs 2B-2F which illustrate the behavior of various signals within that circuit.

For example, consider FIG. 2C which shows the output of under-voltage sensing comparator 108 during circuit operation. As shown, the output of comparator 108 produces waveform 225, which becomes a logic high whenever the input voltage falls below output by $V_{LTH}$.

Similarly, FIG. 2E shows waveform 235 which is the output of detection and suppression circuit 110 on conduction path 112 generated in response to the output of comparator 108 (shown in FIG. 2C). These signals direct gate driver 105 to turn OFF NMOS 103 and do not require filtering by detection and suppression circuit 110 (i.e., are not suppressed) in the case where an oscillation condition is caused by turning NMOS 103 OFF. Thus, when a low voltage condition is detected as causing oscillation, OFF commands from comparator 108 may pass through circuit 110 substantially unaltered.

However, in the case where oscillation is caused by turning NMOS 103 ON, OFF signals generated by comparator 108 are suppressed, whereas the ON signals generated by comparator 109 are not suppressed (not shown). Nevertheless, in some embodiments, depending on topology, some filtering of the non-suppressed signals may be necessary, or performed if desired for various known purposes (e.g., to improve stability, establish a specific response time, etc.).

On the other hand, the output of over-voltage sensing comparator 109, which is responsible for turning NMOS 103 ON, requires suppression when signal oscillation is detected in order to prevent chatter and instability in circuit 100. This is shown by waveform 230 in FIG. 2D, which represents the output of detection and suppression circuit 110 on conduction path 111 based on the output of comparator 109 (shown in FIG. 2B). As shown, after time $t_1$ when oscillation is detected, substantially all of the output signals from comparator 109 are suppressed.

FIG. 2F shows waveform 240 which is produced by gate driver 105 in response to the signals received from detection and suppression circuit 110. It illustrates that a logic high signal is applied to the gate of NMOS 103 prior to the beginning of the oscillation at time $t_1$. After time $t_1$, circuit 110 suppresses ON signals produced by comparator 109 and instructs gate driver 105 to turn OFF NMOS 103, thereby preventing a rapid ON-OFF sequence of circuit 100 that would normally occur during a detected oscillation.

Moreover, in some embodiments, gate driver circuit 105 may continue to provide a logic high signal to the gate of NMOS 103 until receiving an explicit instruction from detection and suppression circuit 110 to provide a logic low and turn it OFF (as illustrated by FIGS. 2E and 2F). In such embodiments, gate driver 105 may maintain NMOS 103 either in either an ON or OFF state until a command signal is received which necessitates changing that state (e.g., will remain ON until commanded OFF or will remain OFF until commanded ON).

Circuit 100, including oscillation detection and suppression circuit 110, may operate in three (or more) modes or states. This is generally depicted in FIG. 3 by state diagram 300. As shown, circuit 100 may operate in a transparent state 301, an input low voltage state 310, and an input high voltage state 320. During normal operation, when power is flowing within normal operating parameters from source 101 to load 104, circuit 100 is in the transparent state. In this state, the control signals produced by comparators 108 and 109 are passed through detection and suppression circuit 110 substantially unaltered and are used to control NMOS 103 through gate driver circuit 105.

When an input under-voltage condition is sensed by comparator 108, however, circuit 100 senses the beginning of a possible oscillating signal period, and transitions from transparent state 301 to input low voltage state via path 302. The sensing of this initial input under-voltage condition (and thus possible signal oscillation) causes detection and suppression circuit 110 to suppress any subsequent ON signals supplied by comparator 109 for a preset period of time, which may be referred to as the suppression interval. During this interval, it is not necessary to suppress OFF signals generated by comparator 108.

The preset period of time may be determined based on the time constant associated with parasitic inductance 102 and parasitic capacitance 114, and its associated decay time in view of circuit dynamics, or may be selected by a circuit designer or end user to achieve specific operational goals (e.g., longer to ensure stability or somewhat shorter to improve response time, etc.)

Accordingly, when an under-voltage condition is detected, a timing circuit in detection and suppression circuit 110 is triggered, initiating a suppression interval. This may cause a control signal to be generated in circuit 110 that suppresses any turn ON commands for the specified preset period of time. After the suppression interval has elapsed, the control signal returns circuit 100 to the transparent state 301 (via path 304), now permitting circuit 110 to issue turn ON commands to gate driver 105.

Similarly, when an input over-voltage condition is sensed by comparator 109, circuit 100 transitions from transparent state 301 to input high voltage state via path 305. The sensing of an over-voltage condition causes detection and suppression circuit 110 to suppress any subsequent OFF signals supplied by comparator 108 for a preset period of time, i.e., a suppression interval as described above. During this interval, it is not necessary to suppress ON signals generated by comparator 109. In some embodiments of the present invention, this preset period of time is substantially the same in both the low voltage and high voltage states, but may vary depending on circuit topology or desired performance goals.

Accordingly, when an input over-voltage condition is detected, a timing circuit in detection and suppression circuit 110 may be triggered, initiating a suppression interval. This may cause a control signal to be generated in circuit 110 that suppresses any turn OFF commands from circuit 110 for the preset period of time. After the suppression interval has elapsed, the control signal may return circuit 100 to the transparent state 301 (via path 303), with the control signal now permitting circuit 110 to issue turn OFF commands to gate driver 105.

Figure 3:
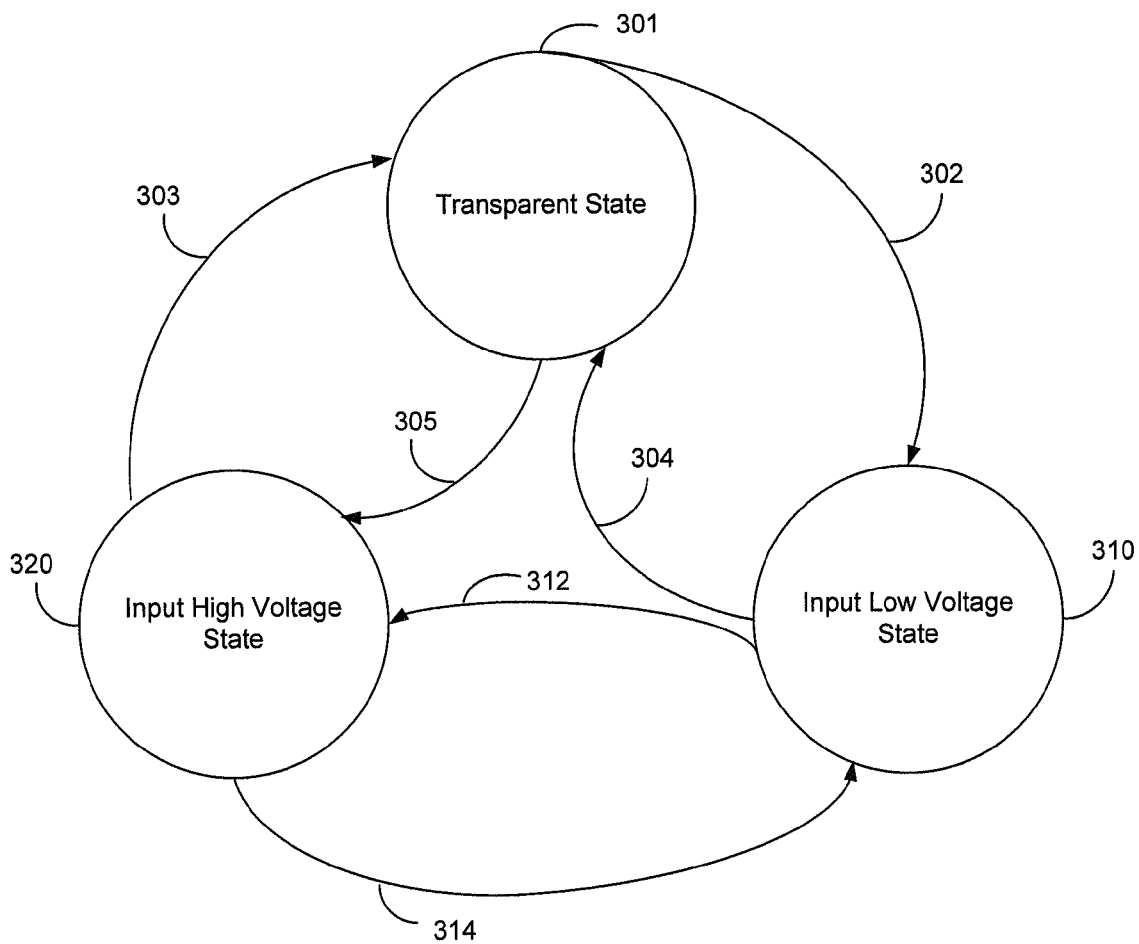
FIG. 3 is a state diagram illustrating several different states of operation of the switching circuit shown in FIG. 1.

As shown in FIG. 3, however, it is possible to transition directly from input low voltage state 310 to input high voltage state 320 and vice versa. This may occur, for example, in the case where the input conditions change during a suppression interval, causing comparators 108 and 109 to produce signals indicating the change of state.

For example, comparator 108 may sense an input under-voltage condition and causing circuit 100 to enter input low voltage state 310 for a suppression interval. During this suppression interval, comparator 109 may sense an over-voltage condition and report this to suppression and detection circuit 110. This causes circuit 100 to transition from low voltage state 310 to high voltage state 320 (through path 312) based on information provided to detection suppression circuit 110. The opposite may occur subsequently, and circuit 100 may transition back and forth between states 310 and 320 several times during single suppression interval. During such transitions, however, the signal commanding gate driver 105 to turn NMOS 103 ON (through path 111) continues to be suppressed.

In some embodiments of the invention, when circuit 100 transitions from input low voltage state 310 to input high voltage state 320, the suppression interval does not reset. That is, although circuit 100 may transition one or more times between states 310 and 320, circuit 100 transitions back to transparent state 301 after the first transition period elapses before another suppression interval may be triggered.

For example, if a period of 100 microseconds is selected for the suppression interval, circuit 100 may transition one or more times between states 310 and 320 within that interval. After the 100 microsecond interval elapses, circuit 100 returns to the transparent state 301, and may immediately transition to state 310 or 320, depending on circuit conditions, which triggers another suppression interval.

In other embodiments of the invention, when circuit 100 transitions from input low voltage state 310 to input high voltage state 320 (or vice versa), the suppression interval may be reset iteratively. That is, each time circuit 100 transitions between states 310 and 320, the suppression interval resets such that the suppression interval continues until sensed circuit conditions warrant transitioning back to transparent state 301.

For example, if a period of 10 microseconds is selected for the suppression interval, circuit 100 may transition one or more times between states 310 and 320 within that interval (or subsequent intervals). Each time such a transition occurs, the 10 microsecond interval resets, such that circuit 100 remains in a continuous suppression interval, returning to transparent state 301 10 microseconds after the last switch from state 310 to 320 occurs (or vice versa).

Figure 4A:
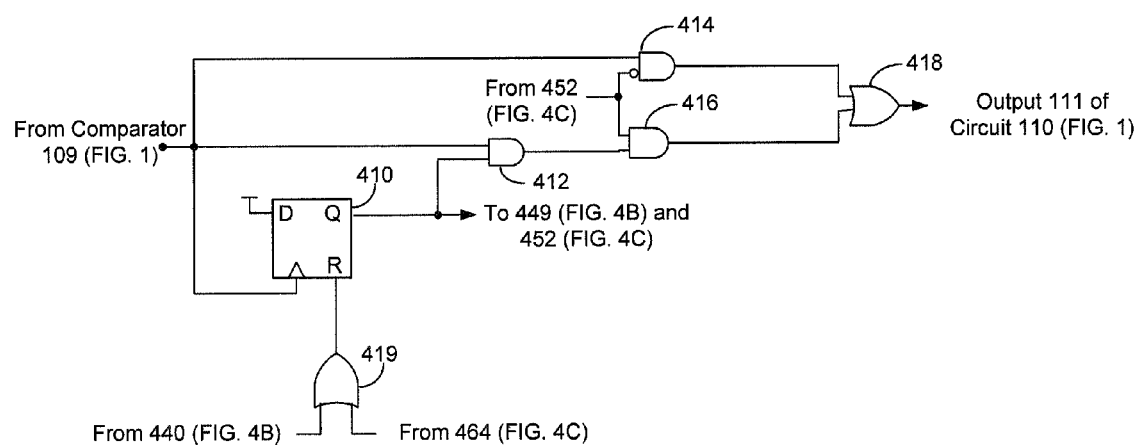
FIGS. 4A-4C are schematic diagrams illustrating certain aspects of an oscillation detection and suppression circuit constructed in accordance with the principles of the present invention.
Figure 4B:
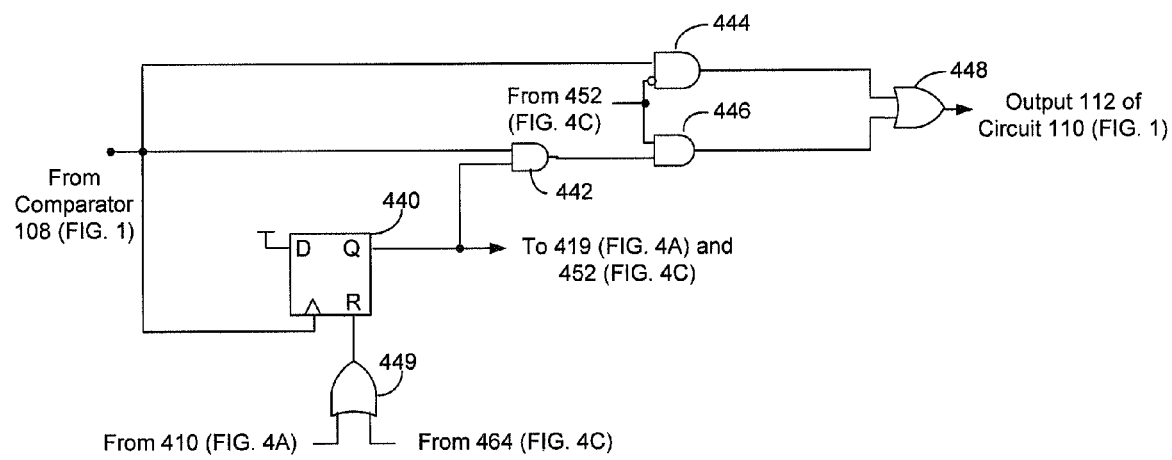
Figure 4C:
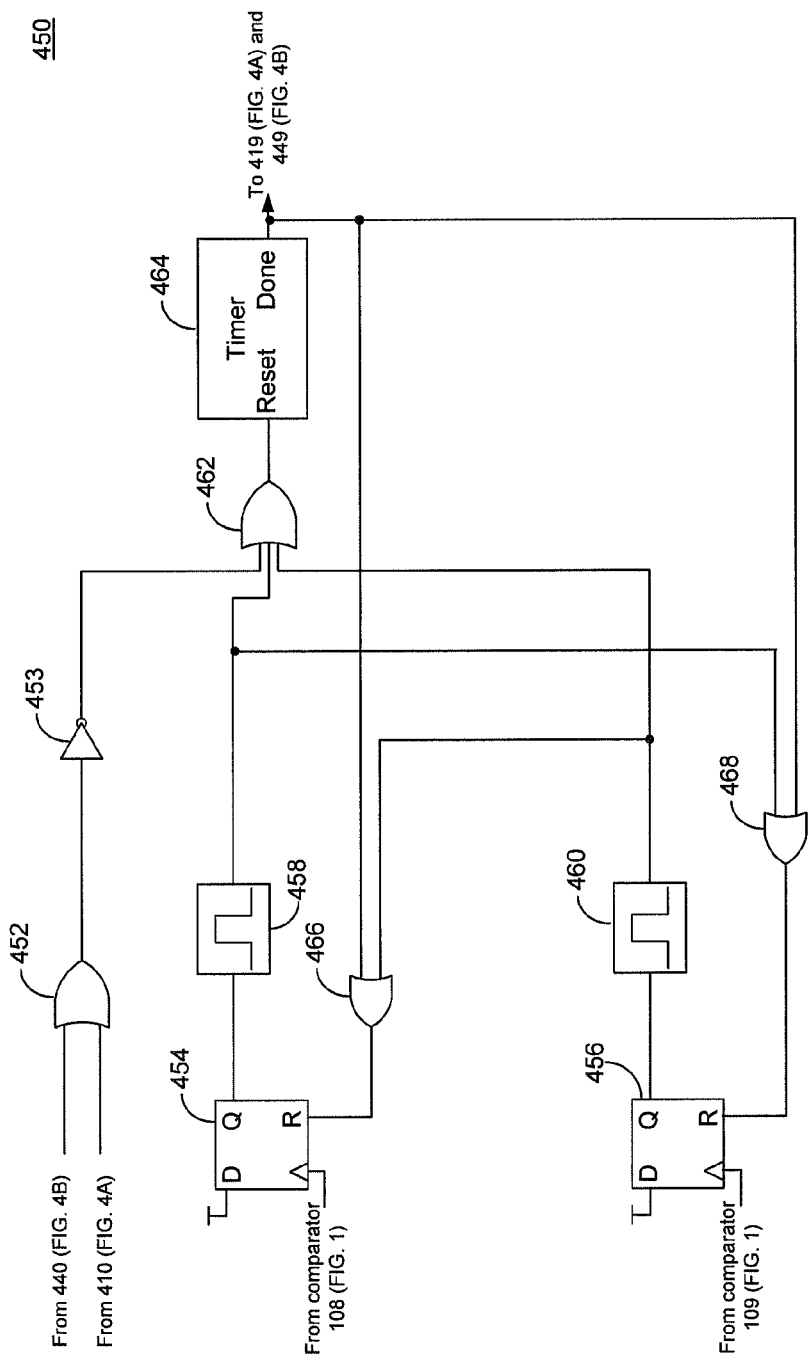

Some possible specific embodiments of circuitry included in oscillation suppression and timing circuit 110 are shown in FIGS. 4A-4C. In particular, FIGS. 4A and 4B show the circuitry used to selectively issue ON and OFF commands to gate driver circuit 105 (FIG. 1), which may be selectively suppressed as described above.

More specifically, FIG. 4A may include a rising-edge triggered flip flop 410, AND gates 412-416, and OR gates 418 and 419. As shown, the D input of flip flop 410 may be coupled to a voltage rail, with the output of comparator 109 coupled to its clock input. Thus, in operation, the Q output of flip flop 410 will remain a logic high based on the rising edge provided by the output of comparator 109 unless it is reset by a signal applied to its R input from OR gate 419 (based on signals from flip flop 440 or timing circuit 464, shown in FIGS. 4B and 4C, discussed in more detail below).

As shown, one input of AND gates 412 and 414 are connected to the output of comparator 109 with the other inputs connected to the output of flip flop 410 and OR gate 452, respectively. The output of OR gate 452 indicates whether timing circuit 464 is running (both in FIG. 4C). In operation, circuit 400 will output the signal provided by comparator 109 unless a reset or suppression signal is received at the R input of flip flop 410 from OR gate 419.

Similarly, FIG. 4B may include a rising-edge triggered flip flop 440, AND gates 442-446 and OR gates 448 and 449. As shown the D input of flip flop 440 may be coupled to a voltage rail, with the output of comparator 108 coupled to its clock input. Thus, in operation, the Q output of flip flop 440 will remain a logic high based on the rising edge provided by the output of comparator 108 unless it is reset by a signal applied to its R input from OR gate 449 (based on signals from flip flop 410 or timing circuit 464 shown in FIGS. 4A and 4C, discussed in more detail below).

As shown, one input of AND gates 442 and 444 are connected to the output of comparator 108 with the other inputs connected to the output of flip flop 440 and OR gate 452 in FIG. 4C respectively. In operation, circuit 430 will output the signal provided by comparator 108 unless a reset or suppression signal is received at the R input of flip flop 440 from OR gate 449.

FIG. 4C illustrates a circuit 450 which may be a portion of oscillation detection and suppression circuit 110 that is useful for generating a suppression control signal used by circuits 400 and 430 depicted in FIGS. 4A and 4B. As shown, circuit 450 may include rising-edge triggered flip flops 454 and 456, OR gates 452, 462, 466 and 468, inverter 453, rising-edge triggered one-shot pulse generators 458 and 460 and timing circuit 464.

In operation, the D input of flip flop 454 may be coupled to a voltage rail, with the output of comparator 108 coupled to its clock input. Thus, the Q output of flip flop 454 will remain a logic high based on the rising edge provided by the output of comparator 108 unless it is reset by a signal from one shot 460 or timing circuit 464 at its R input (through OR gate 466). When a logic high output is produced by flip flop 454, one shot 458 produces an output pulse which causes OR gate 462 to reset timer 464.

Similarly, the D input of flip flop 456 may be coupled to a voltage rail, with the output of comparator 109 coupled to its clock input. Thus, the Q output of flip flop 456 will remain a logic high based on the rising edge provided by the output of comparator 109 unless it is reset by a signal from one shot 458 or timing circuit 464 at the R input (through OR gate 468). When a logic high output is produced by flip flop 456, one shot 460 produces an output pulse which causes OR gate 462 to reset timer 464. Moreover, circuit 450 includes OR gate 452 which receives suppression signals from the output of flip flops 410 and 440 respectively. These signals are processed by OR gate 452 and inverted by inverter 453 and provided to OR gate 462.

Accordingly, in operation, the appropriate signals from comparators 108 and 109 or flip flops 410 or 440 may trigger a reset of timer 464. In embodiments where timer 464 does not retrigger until circuit 100 returns to transparent state 301, the output of inverter 453 may be coupled to Reset input of timer 464, with 454 to 460 not required (not shown).

Figure 5:
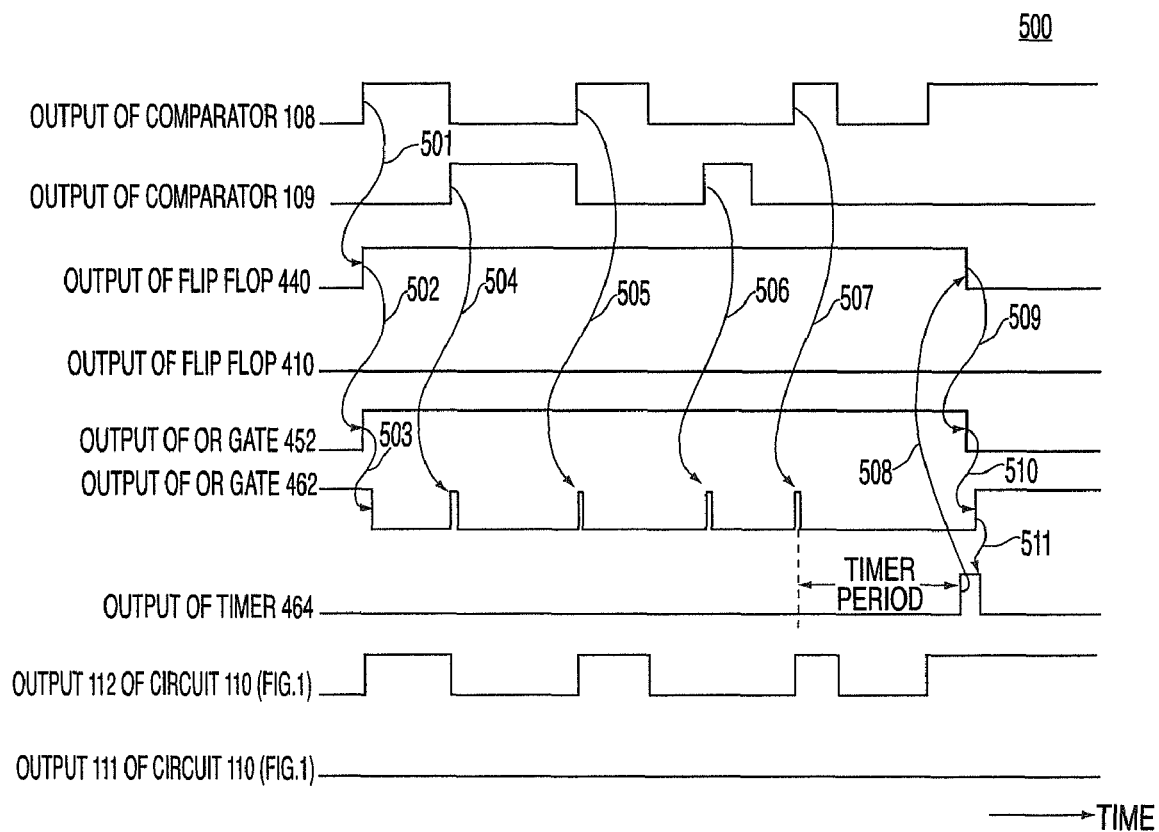
FIG. 5 is a timing diagram illustrating certain other aspects of an oscillation detection and suppression circuit constructed in accordance with the principles of the present invention.

The operation of the circuits shown in FIGS. 4A-4C may be better understood by considering the timing diagram 500 shown in FIG. 5, which illustrates certain signals generated by the various circuit components therein. For example, when the output of comparator 108 goes high, indicating an input under-voltage condition is sensed, the Q output of flip flop 440 (FIG. 4B) becomes a logic high. This is shown at point 501 in timing diagram 500 and is represented in FIG. 3 by the transition from transparent state 301 to input low voltage state 310.

The output of flip flop 440 is also provided to the input of OR gate 452 in (FIG. 4C) which produces a logic high at its output at point 502, and a logic low at the output of inverter 453 causing the output of OR gate 462 to a logic low at point 503, releasing timer 464 out of the reset state.

This causes the R input signal on flip flop 410 to remain a logic high, forcing the output of OR gate 418 low (i.e., output 111 of circuit 110). As shown by points 504-507 in FIG. 5, alternate rising edges generated by comparators 108 and 109 indicating subsequent input under-voltage and over-voltage conditions (oscillation) continue to occur before the suppression interval completes. In FIG. 3, this is represented by changing back and forth between input low voltage state 310 and input high voltage state 320.

After the last under-voltage condition resets the timer (at point 507) the oscillation subsides (due to the end of, or reduction in magnitude of, the oscillating signal), and the suppression interval is allowed to complete, output of timer 464 (at point 508) goes high. This resets flip flop 440 (at point 509), which causes the output of OR gate 452 to become a logic low (point 510) resetting timer 464 (at point 511), returning circuit 100 to the transparent state. In FIG. 3, this condition is represented by transitioning from input low voltage state 310 to transparent state 301.

In embodiments where the suppression interval does not reset, the output of timer 464 becomes a logic high at the expiry of the suppression interval (e.g., somewhat after transition point 504), which would reset flip flop 440, causing the output of OR gate 452 to become a logic low and resetting timer 464, returning circuit 100 to the transparent state (not shown). Subsequent changes, such as the output of comparator 108 (such as at transition point 505) would then cause circuit 100 to re-enter the low voltage state as described above.

FIG. 5 illustrates circuit node waveforms for the case where the timer circuit is started due to an initial input under-voltage event. This causes ON signals to be suppressed by oscillation detection and suppression circuit 110. However, the behavior of circuit 100 is symmetric in that it operates similarly to an initial input over-voltage event by suppressing the OFF signals.

It will be appreciated that the circuits and methods described herein have broad based applicability to virtually all circuit applications implementing an ideal diode function. Such applications may include, but are not limited to, redundant power supplies, hot swap voltage controllers, load share controllers, power path controllers, low voltage power supplies and regulators, telecommunications systems, etc.

Detailed embodiments of the present invention are disclosed herein, however, it is to be understood that the disclosed embodiments are merely exemplary of the invention, which may be embodied in various forms and can be practiced by other than the described embodiments. For example, the sensing circuitry shown herein as comparators 108 and 109 may be combined to a single comparison circuit with hysteresis providing both the upper and lower voltage thresholds (not shown). Other similar known changes or substitutions to and from well known circuit configurations circuits in specific embodiments will be understood to be encompassed by the above specification.

Therefore, specific functional details disclosed herein are not to be interpreted as limiting, but merely as a basis for supporting the claims and as a representative basis for teaching one skilled in the art to variously employ the present invention in virtually any appropriately detailed embodiment.

What is claimed is:

1. A switching circuit that produces an output signal and being configured to reduce the effects of signal oscillation on the operation of the switching circuit, comprising:
    an input node for receiving an input signal;
    a sensing circuit that senses variation in the input signal; and
    an oscillation detection and suppression circuit coupled to the sensing circuit that detects signal oscillation based on a control signal received from the sensing circuit, wherein the oscillation detection and suppression circuit is configured with a timer circuit to selectively suppress the control signal for a prescribed fixed duration when a signal oscillation state is detected, allowing the switching circuit to remain in an ON or OFF state during the signal oscillation such that stored energy causing the signal oscillation is allowed to decay.

2. The switching circuit of claim 1, wherein the sensing circuit is configured for sensing variation in the output signal.

3. The switching circuit of claim 1, wherein the sensing circuit is configured to detect an under-voltage condition, and an over-voltage condition.

4. The switching circuit of claim 3 wherein turn ON commands are suppressed when an under-voltage condition at the input is detected by the sensing circuit.

5. The switching circuit of claim 3 wherein turn OFF commands are suppressed when an over-voltage condition at the input is detected by the sensing circuit.

6. The switching circuit of claim 3, wherein the sensing circuit further comprises a hysteric comparison circuit for detecting an under-voltage condition, and an over-voltage condition.

7. The switching circuit of claim 3, wherein the sensing circuit further comprises a first comparison circuit for detecting an under-voltage condition, and a second comparison circuit for detecting an over-voltage condition.

8. The switching circuit of claim 1, wherein the oscillation detection and suppression circuit continues to suppress the control signal until oscillation substantially subsides.

9. The switching circuit of claim 1, further comprising a semiconductor element operating as an ideal diode switch.

10. The switching circuit of claim 9, wherein the semiconductor element is driven by a gate driver circuit having a fast turn ON capability.

11. The switching circuit of claim 10, wherein the gate driver circuit includes a voltage multiplier circuit.

12. The switching circuit of claim 11, wherein the gate driver circuit further includes a reservoir capacitor coupled to the voltage multiplier circuit.

13. A switching circuit that produces an output signal and being configured to reduce the effects of signal oscillation on the operation of the switching circuit comprising:
    an input node for receiving an input signal,
    a sensing circuit that senses variation in the output signal;
    a semiconductor switch operating as an ideal diode; and
    an oscillation detection and suppression circuit coupled to the sensing circuit that detects signal oscillation based on a control signals received from the sensing circuitry, wherein the oscillation detection and suppression circuitry is configured with a timer circuit operative to selectively suppress each of the control signals that control the semiconductor switch for a prescribed fixed duration when a signal oscillation state is detected, such that stored energy causing the signal oscillation is allowed to decay.

14. The switching circuit of claim 13, wherein the sensing circuit is configured to sense variation in the input signal.

15. The switching circuit of claim 13, wherein the sensing circuit is configured to detect an under-voltage condition, and an over-voltage condition.

16. The switching circuit of claim 15 wherein turn ON commands are suppressed when an over-voltage condition at the output is detected by the sensing circuit.

17. The switching circuit of claim 15 wherein turn OFF commands are suppressed when an under-voltage condition at the output is detected by the sensing circuit.

18. The switching circuit of claim 15, wherein the sensing circuit further comprises a hysteric comparison circuit for detecting an under-voltage condition, and an over-voltage condition.

19. The switching circuit of claim 15, wherein the sensing circuit further comprises a first comparison circuit for detecting an under-voltage condition, and a second comparison circuit for detecting an over-voltage condition.

20. The switching circuit of claim 13, wherein the oscillation detection and suppression circuit continues to suppress the control signal until oscillation subsides.

21. The switching circuit of claim 13, wherein the semiconductor element is driven by a gate driver circuit having a fast turn ON capability.

22. The switching circuit of claim 21, wherein the gate driver circuit includes a voltage multiplier circuit.

23. The switching circuit of claim 22, wherein the gate driver circuit further includes a reservoir capacitor coupled to the voltage multiplier circuit.

24. The switching circuit of claim 13 wherein the semiconductor element is driven by a gate driver circuit having a fast turn OFF capability.

25. A switching circuit that produces an output signal and being configured to reduce the effects of signal oscillation on the operation of the switching circuit, comprising:
   an input node for receiving an input signal;
   a sensing circuit that senses variation in the input signal; and
   an oscillation detection and suppression circuit coupled to the sensing circuit that detects signal oscillation based on a control signal received from the sensing circuit, wherein the oscillation detection and suppression circuit comprises a timer circuit for producing a suppression signal having a fixed duration which is less than the duration of the oscillation, the timer circuit being operative to produce the suppression signal in response to the control signal received from the sensing circuit to selectively suppress the control signal for the suppression signal duration each time a signal oscillation state is detected, allowing the timer circuit thereby to successively produce suppression signals during the detected period of oscillation for holding the switching circuit in an ON or OFF state during the duration of the detected oscillation such that stored energy causing the signal oscillation is allowed to decay.

26. A switching circuit that produces an output signal and being configured to reduce the effects of signal oscillation on the operation of the switching circuit, comprising:
   an input node for receiving an input signal;
   a sensing circuit that senses variation in the output signal to detect a signal oscillation;
   a semiconductor switch operating as an ideal diode; and
   an oscillation detection and suppression circuit coupled to the sensing circuit that detects signal oscillation based on control signals received from the sensing circuit that control the semiconductor switch, wherein the oscillation detection and suppression circuitry is configured to selectively suppress the control signals when a signal oscillation state is detected, the oscillation detection and suppression circuit comprising a timer circuit for successively producing suppression signals each for a fixed duration less than that of the duration of the oscillation, the timer circuit being configured to be responsive to an output of the sensing circuit to successively suppress the control signals for the duration set by the timer circuit as signal oscillation states are successively detected, thereby causing the switching circuit to remain in an ON or OFF state during the duration of the detected oscillation such that stored energy causing the signal oscillation is allowed to decay.

* * * * *